US012675628B2

(12) United States Patent
Dia et al.

(10) Patent No.: US 12,675,628 B2
(45) Date of Patent: Jul. 7, 2026

(54) SEMICONDUCTOR STRUCTURE OF CELL ARRAY WITH ADAPTIVE THRESHOLD VOLTAGE

(71) Applicant: MEDIATEK INC., Hsinchu City (TW)

(72) Inventors: Kin-Hooi Dia, Hsinchu City (TW); Ho-Chieh Hsieh, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 1015 days.

(21) Appl. No.: 17/708,438

(22) Filed: Mar. 30, 2022

(65) Prior Publication Data

US 2022/0343053 A1 Oct. 27, 2022

Related U.S. Application Data

(60) Provisional application No. 63/178,627, filed on Apr. 23, 2021.

(51) Int. Cl.
*G06F 30/398* (2020.01)
*G06F 30/3312* (2020.01)
(Continued)

(52) U.S. Cl.
CPC ........ *G06F 30/398* (2020.01); *G06F 30/3312* (2020.01); *G06F 30/392* (2020.01); *H10D 84/856* (2025.01)

(58) Field of Classification Search
CPC ............ G11C 16/3427; G11C 13/0069; G11C 11/5628; G11C 11/2259; G11C 11/2257;
(Continued)

(56) References Cited

U.S. PATENT DOCUMENTS 7,797,646 B2 9/2010 Chung
9,300,506 B2 3/2016 Arai
(Continued)

FOREIGN PATENT DOCUMENTS

CN 103577374 A 2/2014
CN 109768013 A 5/2019
(Continued)

OTHER PUBLICATIONS

German language office action dated May 15, 2024, issued in application No. DE 10 2022 109 400.6.
(Continued)

*Primary Examiner* — Binh C Tat
(74) *Attorney, Agent, or Firm* — McClure, Qualey & Rodack, LLP

(57) ABSTRACT

Semiconductor structures are provided. A semiconductor structure includes a cell array. The cell array includes a first regular cell, a second regular cell and a first mixed cell. Each P-type transistor has a first threshold voltage and each N-type transistor has a second threshold voltage in the first regular cell. Each P-type transistor has a third threshold voltage and each N-type transistor has a fourth threshold voltage in the second regular cell. Each P-type transistor has the first threshold voltage and each N-type transistor has the fourth threshold voltage in the first mixed cell. The first regular cell, the second regular cell and the first mixed cell are arranged in the same row of the cell array. The first mixed cell is arranged between the first and second regular cells and is in contact with the first regular cell.

11 Claims, 11 Drawing Sheets

(51) Int. Cl.
*G06F 30/392* (2020.01)
*H10D 84/85* (2025.01)

(58) Field of Classification Search
CPC ....... G11C 8/08; G11C 5/147; G11C 11/5642; G11C 2029/5004; G11C 29/50004; G11C 11/4097; G11C 7/1015; G11C 11/1673; G11C 29/783; G11C 16/3418; G11C 11/404; G11C 11/405; G11C 14/0063; G11C 16/102; G11C 16/3459; G11C 16/3445; G11C 5/145; G11C 11/2275; G11C 29/70; G11C 11/4094; G11C 16/0433; G11C 16/0441; G11C 16/0466; G11C 16/24; G11C 16/16; G11C 16/0483; G11C 16/10; G11C 16/08; H01L 2924/12036; H01L 2924/14511; H01L 2924/1437; H01L 2924/13063; H01L 2924/13064; H01L 2924/1441; G06F 3/0604; G06F 3/0659; G06F 3/0673; G06F 9/30098; G06F 12/0873; G06F 12/0802; G06F 2212/60; G06F 12/1425; G06F 11/0727; G06F 2212/72; G06F 2212/608; G06F 11/1068; G06F 12/0893; G06F 12/1045; G06F 12/0246; G06F 30/392; G06F 2119/06; G06F 3/0616; G06F 30/3312; G06F 30/398; G06F 9/4498; G06F 12/0238; G06F 12/10; G03F 9/7076; G03F 9/7084; H10B 43/35; H10B 12/036; H10B 12/056; H10B 12/00; H10B 12/33; H10B 63/34; H10B 12/033; H10B 12/395; H10B 53/00
USPC .................................................. 716/100–106
See application file for complete search history.

(56) References Cited

U.S. PATENT DOCUMENTS

| | | | |
|---|---|---|---|
| 10,586,586 B1 * | 3/2020 | Lee ..................... | G11C 11/4085 |
| 10,978,570 B2 | 4/2021 | Kim et al. | |
| 11,309,306 B2 | 4/2022 | Yang et al. | |
| 11,322,410 B2 | 5/2022 | Cheng et al. | |
| 2008/0010626 A1 | 1/2008 | Correale | |
| 2010/0070933 A1 | 3/2010 | Quach | |
| 2011/0261634 A1 * | 10/2011 | Venugopal ........... | G11C 11/413 |
| | | | 365/189.011 |
| 2015/0009749 A1 * | 1/2015 | Chen ..................... | G11C 11/413 |
| | | | 365/156 |
| 2018/0151550 A1 | 5/2018 | Peng | |
| 2019/0325934 A1 * | 10/2019 | Matsubara .......... | G11C 11/2293 |
| 2020/0051659 A1 * | 2/2020 | Matsubara ........... | G11C 29/832 |
| 2020/0227122 A1 | 7/2020 | Shibata et al. | |
| 2020/0395056 A1 * | 12/2020 | Visconti ................ | G06F 3/0673 |
| 2021/0012818 A1 * | 1/2021 | Lam ......................... | G11C 7/12 |

FOREIGN PATENT DOCUMENTS

| | | |
|---|---|---|
| CN | 110034114 A | 7/2019 |
| TW | 202013224 A | 4/2020 |

OTHER PUBLICATIONS

Lin, J-Y., et al.; "Mixed-VTH (MVT) CMOS Circuit Design for Low Power Cell Libraries;" Sep. 2007; pp. 181-184.
Chinese language office action dated Feb. 4, 2023, issued in application No. TW 111115220.

* cited by examiner

START

Obtain layout of cell array formed by regular cells — S210

Obtain mixed cell library — S220

Replace regular cells with mixed cells according to critical path or specific configuration — S230

Obtain layout of cell array with balance threshold voltage — S240

END

SEMICONDUCTOR STRUCTURE OF CELL ARRAY WITH ADAPTIVE THRESHOLD VOLTAGE

CROSS REFERENCE TO RELATED APPLICATIONS

This application claims priority of U.S. Provisional Application No. 63/178,627, filed on Apr. 23, 2021, the entirety of which is incorporated by reference herein.

BACKGROUND OF THE INVENTION

Field of the Invention

The invention relates to a cell array, and more particularly to a cell array formed by cells with adaptive voltages.

Description of the Related Art

Integrated circuits (ICs) have become increasingly important. Devices using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

With the increasing down-scaling of integrated circuits, the integrated circuits become more compact. For various cells that are frequently used in integrated circuits, process control limitation will cause the unbalance threshold voltages between N-type and P-type transistors, and the unbalance threshold voltages will be further deteriorated by the circuit topology (e.g. stack gate) and layout-dependent (LDE) effect (e.g. diffusion break effect).

BRIEF SUMMARY OF THE INVENTION

Semiconductor structures are provided. An embodiment of a semiconductor structure is provided. The semiconductor structure includes a cell array. The cell array includes a first regular cell, a second regular cell and a first mixed cell. Each P-type transistor has a first threshold voltage and each N-type transistor has a second threshold voltage in the first regular cell. Each P-type transistor has a third threshold voltage and each N-type transistor has a fourth threshold voltage in the second regular cell. Each P-type transistor has the first threshold voltage and each N-type transistor has the fourth threshold voltage in the first mixed cell. The first regular cell, the second regular cell and the first mixed cell are arranged in the same row of the cell array. The first mixed cell is arranged between the first and second regular cells and is in contact with the first regular cell.

Furthermore, an embodiment of a semiconductor structure is provided. The semiconductor structure includes a cell array. The cell array includes a first mixed cell and a second mixed cell. The first mixed cell includes at least one first P-type transistor with a first threshold voltage and at least one first N-type transistor with a second threshold voltage in a first row of the cell array, and at least one second P-type transistor with a third threshold voltage and at least one second N-type transistor with a fourth threshold voltage in a second row of the cell array. The second mixed cell includes at least one of the second P-type transistor with the third threshold voltage and at least one of the first N-type transistor with the second threshold voltage in the first row of the cell array, and at least one of the second P-type transistor with the third threshold voltage and at least one of the first N-type transistor with the second threshold voltage in the second row of the cell array. The first and second rows of the cell array are the same height. The first voltage difference between the first and second threshold voltages is different from the second voltage difference between the third and fourth threshold voltages.

Moreover, an embodiment of a method for providing a cell array. The original layout of the cell array is obtained. The original layout includes a first regular cell and a second regular cell arranged in a first row of the cell array and in contact with each other. The first regular cell is replaced with a first mixed cell to obtain a modified layout. An integrated circuit is fabricated according to the modified layout. In the first regular cell, each P-type transistor has a first threshold voltage and each N-type transistor has a second threshold voltage. In the second regular cell, each P-type transistor has a third threshold voltage and each N-type transistor has a fourth threshold voltage. In the first mixed cell, each P-type transistor has the first threshold voltage and each N-type transistor has the fourth threshold voltage. The first voltage difference between the first and second threshold voltages is different from the second voltage difference between the third and fourth threshold voltages, and a third voltage difference between the first and fourth threshold voltages is less or more than the first and second voltage differences.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Figure 1:
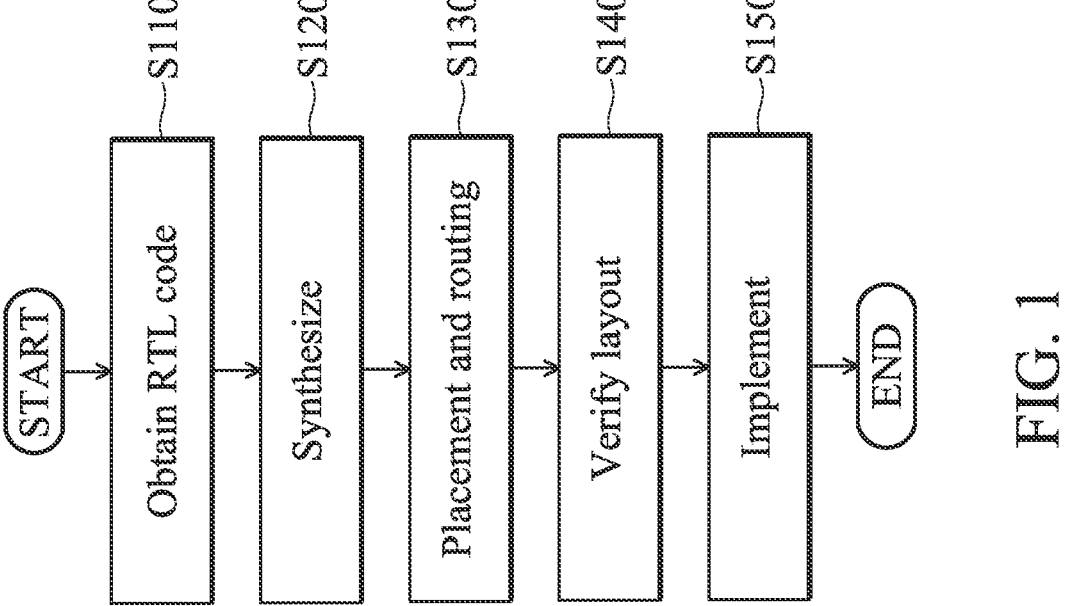
FIG. 1 is a flowchart illustrating a hierarchical design process of an integrated circuit (IC).

FIG. 1 is a flowchart illustrating a hierarchical design process of an integrated circuit (IC). In step S110, a register-transfer level (RTL) code describing the function performed by the IC is obtained. The RTL code may indicate that a design is performed using a language describing hardware, such as a Hardware Description Language (HDL). In step S120, the RTL code is synthesized to generate a netlist including gates (or cells) of the IC. In general, the IC includes a plurality of blocks, and each block provides a significant function for the IC, such as a specific processor (e.g. an application processor, a video processor, an audio processor, or a controller), a memory (e.g. a SRAM device) and so on. Furthermore, each block has a corresponding RTL code, and then the RTL code of each block is synthesized to generate the corresponding netlist comprising the gates of the block. Before the RTL code is synthesized, a RTL simulation is performed to check the functional correctness of the RTL code. Furthermore, after obtaining the gates of the block in the netlists, a gate level simulation is performed to check the functional correctness of the netlists. In step S130, according to the gates of the blocks in the netlists, a placement and routing procedure is performed to generate a layout of whole blocks within a chip area of the IC. Thus, according to the placements, a chip placement and routing procedure is performed and a layout is obtained. In some embodiments, the layout is a whole chip layout. In some embodiments, the layout is a portion of a whole chip layout regarding some digital or analog circuits of the IC. In some embodiments, the layout includes one or more cell arrays corresponding to the digital or analog circuits. In step S140, an analysis procedure is performed and the layout is verified to check whether the layout violates any of the various constraints or rules. After the layout is completed, design rule check (DRC), layout versus schematic (LVS) and electric rule check (ERC) are performed. The DRC is a process of checking whether the layout is successfully completed with a physical measure space according to the design rule, and the LVS is a process of checking whether the layout meets a corresponding circuit diagram. In addition, the ERC is a process of for checking whether devices and wires/nets are electrically well connected. Furthermore, a post-simulation is performed to check the functional completeness of the layout by extracting and simulating a parasitic component, such as a parasitic capacitance. If there are no violations in the layout, the IC is fabricated (or implemented) according to the layout (step S150). If a violation is present in the layout, the layout of the IC must be modified to handle the violation until no violations are present.

Figure 2:
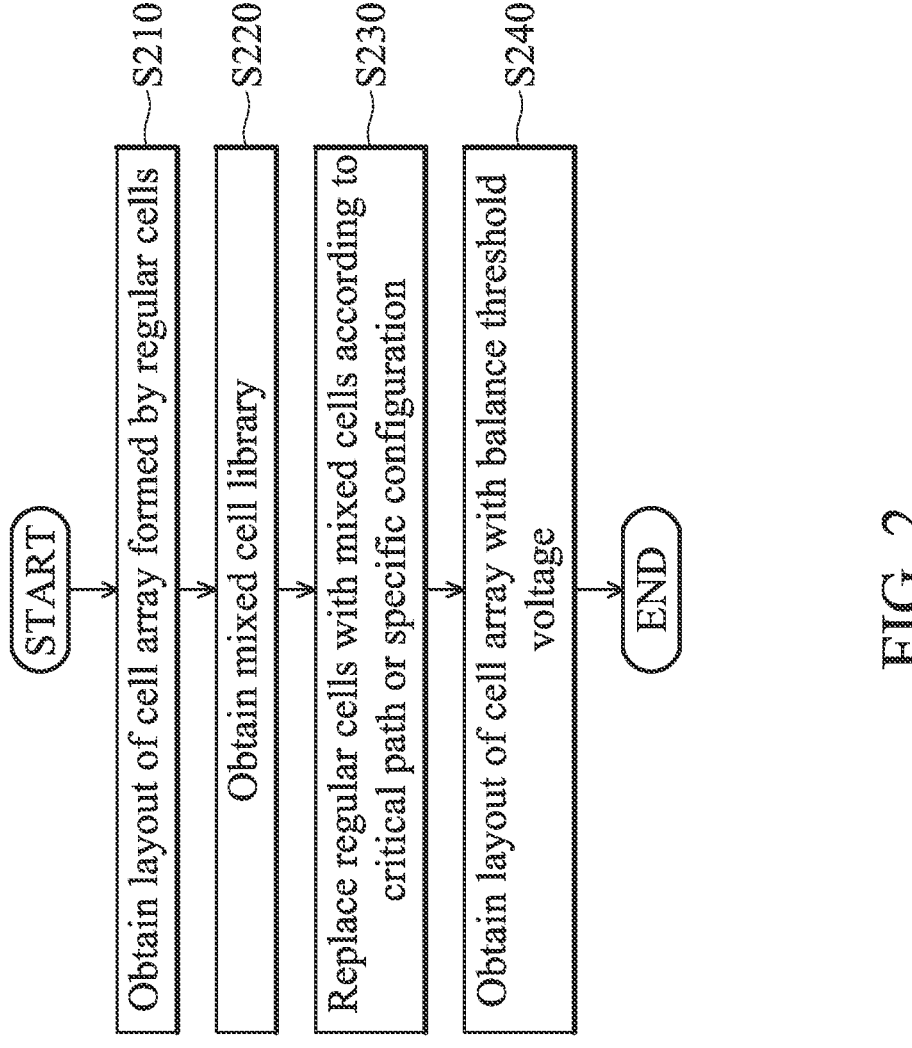
FIG. 2 is a flowchart of a method for providing a cell array with adaptive threshold voltage according to an embodiment of the invention.

FIG. 2 is a flowchart of a method for providing a cell array with adaptive threshold voltage according to an embodiment of the invention, wherein the method of FIG. 2 is performed by a computer capable of operating an electronic design automation (EDA) tool.

First, in step S210, the original layout of a cell array is obtained after the placement and routing procedure of step S130 of FIG. 1 is performed. In the original layout, multiple regular cells from one or more regular cell libraries are arranged in multiple rows of the cell array. In some embodiments, the rows of the cell array may have the same height, i.e., the regular cells have the same cell height. In some embodiments, the rows of the cell array may have the different heights, i.e., the regular cells have the different cell heights. In some embodiments, the regular cells are selected from the group consisting of the standard cells with standard threshold voltages (hereinafter referred to as the first type of regular cells), the standard cells with low leakage and low threshold voltages (hereinafter referred to as the second type of regular cells), the standard cells with low threshold voltages (hereinafter referred to as the third type of regular cells), the standard cells with low leakage and ultra-low threshold voltages (hereinafter referred to as the fourth type of regular cells), the standard cells with ultra-low threshold voltages (hereinafter referred to as the fifth type of regular cells), and the standard cells with extremely-low threshold voltages (hereinafter referred to as the sixth type of regular cells). In each regular cell, the threshold voltages of P-type transistors and the threshold voltages of N-type transistors correspond to the same characteristics. For example, in the third type of regular cell, the P-type transistors P_VT3 and the N-type transistors N_VT3 correspond to the same threshold voltage characteristics.

In step S220, one or more mixed cell libraries are obtained. Each mixed cell library includes the mixed cells, and the P-type transistors and the N-type transistors of each mixed cell correspond to the different threshold voltage characteristics. For example, a first mixed cell is composed of the PMOS transistors P_VT3 of the third type of regular cell and the NMOS transistors N_VT2 of the second type of regular cell and a second mixed cell is composed of the NMOS transistors N_VT3 of the third type of regular cell and the PMOS transistors P_VT2 of the second type of regular cell. In other words, the threshold voltage of P-type transistor and the threshold voltage of N-type transistor in each mixed cell correspond to different types of regular cells.

Figure 3:
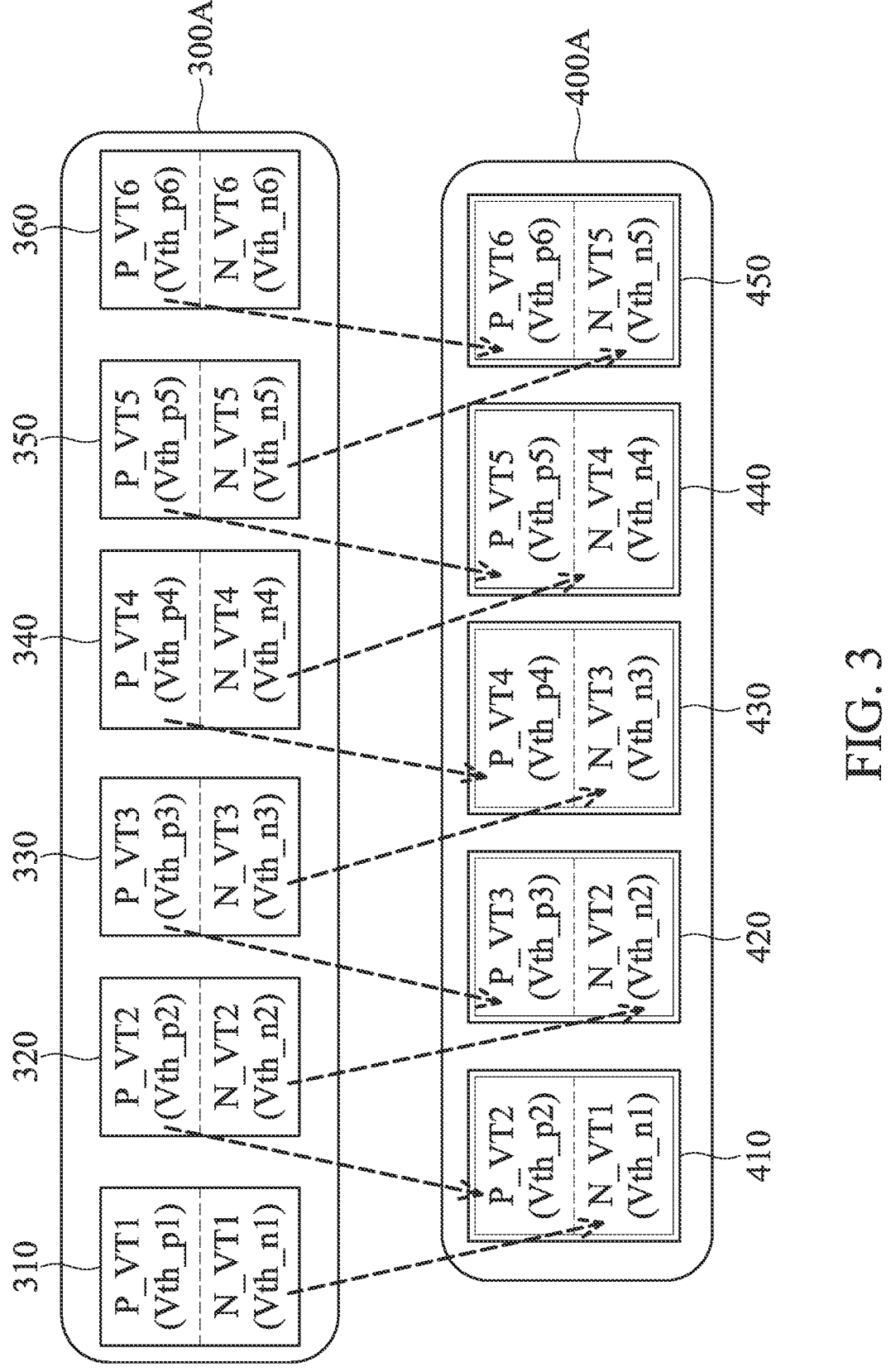
FIG. 3 shows a regular cell library and a mixed cell library according to an embodiment of the invention.

Referring to FIG. 3, FIG. 3 shows a regular cell library 300A and a mixed cell library 400A according to an embodiment of the invention. The regular cell library 300A includes the first type of regular cell 310, the second type of regular cell 320, the third type of regular cell 330, the fourth type of regular cell 340, the fifth type of regular cell 350 and the sixth type of regular cell 360. In FIG. 3, the regular cells 310 through 360 have the same circuit configuration and the same layout size (i.e., cell size) for a standard cell, and the differences between the regular cells 310 through 360 are that the P-type and N-type transistors have respective threshold voltages. In some embodiments, the respective threshold voltages are obtained by using different threshold voltage layers to form the transistors in processes. In some embodiments, the different threshold voltage layers are formed by one or more work-function layers.

In some embodiments, the work-function layer of P-type transistor includes the P-type work-function metal. The P-type work-function metal includes titanium nitride (TiN), tungsten nitride (WN), tantalum nitride (TaN), ruthenium (Ru) or a combination thereof. In some embodiments, the work-function layer of N-type transistor includes the N-type work-function metal. The N-type work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof.

In some embodiments, the work-function layer includes multiple layers combination and selected from a group of TiN, TaN, TiAl, TiAlN, W, or a combination thereof. In some embodiments, the work-function layer is formed by multiple patterns and multiple metal depositions for multiple work-function schemes. Moreover, various threshold voltages are obtained by adjusting the material and/or thickness of the work-function layers.

In the regular cell library 300A, the first type of regular cell 310 has the P-type transistors P_VT1 with the threshold voltage Vth_p1 and the N-type transistors N_VT1 with the threshold voltage Vth_n1. In the layout of first type of regular cell 310, the P-type transistors P_VT1 and the N-type transistors N_VT1 are arranged in the upper and lower regions, respectively. The threshold voltages of the P-type transistor P_VT1 and the N-type transistor N_VT1 are different and have a voltage difference VD_VT1.

The second type of regular cell 320 has the P-type transistors P_VT2 with the threshold voltage Vth_p2 (where Vth_p2<Vth_p1) and the N-type transistors N_VT2 with the threshold voltage Vth_n2 (where Vth_n2<Vth_n1). In the layout of second type of regular cell 320, the P-type transistors P_VT2 and the N-type transistors N_VT2 are arranged in the upper and lower regions, respectively. The threshold voltages of the P-type transistor P_VT2 and the N-type transistor N_VT2 are different and have a voltage difference VD_VT2.

The third type of regular cell 330 has the P-type transistors P_VT3 with the threshold voltage Vth_p3 (where Vth_p3<Vth_p2) and the N-type transistors N_VT3 with the threshold voltage Vth_n3 (where Vth_n3<Vth_n2). In the layout of third type of regular cell 330, the P-type transistors P_VT3 and the N-type transistors N_VT3 are arranged in the upper and lower regions, respectively. The threshold voltages of the P-type transistor P_VT3 and the N-type transistor N_VT3 are different and have a voltage difference VD_VT3.

The fourth type of regular cell 340 has the P-type transistors P_ULVTLL with the threshold voltage Vth_p4 (where Vth_p4<Vth_p3) and the N-type transistors N_UL-VTLL with the threshold voltage Vth_n4 (where Vth_n4<Vth_n3). In the layout of fourth type of regular cell 340, the P-type transistors P_VT4 and the N-type transistors N_VT4 are arranged in the upper and lower regions, respectively. The threshold voltages of the P-type transistor P_VT4 and the N-type transistor N_VT4 are different and have a voltage difference VD_VT4.

The fifth type of regular cell 350 has the P-type transistors P_VT5 with the threshold voltage Vth_p5 (where Vth_p5<Vth_p4) and the N-type transistors N_VT5 with the threshold voltage Vth_n5 (where Vth_n5<Vth_n4). In the layout of fifth type of regular cell 350, the P-type transistors P_VT5 and the N-type transistors N_VT5 are arranged in the upper and lower regions, respectively. The threshold voltages of the P-type transistor P_VT5 and the N-type transistor N_VT5 are different and have a voltage difference VD_VT5.

The sixth type of regular cell 360 has the P-type transistors P_ELVT with the threshold voltage Vth_p6 (where Vth_p6<Vth_p5) and the N-type transistors N_VT6 with the threshold voltage Vth_n6 (where Vth_n6<Vth_n5). In the layout of sixth type of regular cell 360, the P-type transistors P_VT6 and the N-type transistors N_VT6 are arranged in the upper and lower regions, respectively. The threshold voltages of the P-type transistor P_VT6 and the N-type transistor N_VT6 are different and have a voltage difference VD_VT6.

In the regular cell library 300A, each regular cell has unbalance threshold voltages between the P-type and N-type transistors, i.e., there is a larger difference between the threshold voltage of the P-type transistor and the threshold voltage of the N-type transistor. In order to avoid that the unbalance threshold voltages in the P-type and N-type transistors limit the minimum operating voltage (e.g., VDD) of the regular cell, the mixed cells in the mixed cell library 400A that have the adaptive threshold voltages in the P-type and N-type transistors are used.

In the mixed cell library 400A, the mixed cells 410 through 450 have the circuit configuration and the layout size (i.e., cell size) similar with the regular cells 310 through 360. Compared with the regular cells 310 through 360 of the regular cell library 300A, the threshold voltage of the P-type transistor is close to the threshold voltage of the N-type transistor in each of the mixed cells 410 through 450. In other words, each mixed cell in the mixed cell library 400A has less difference between the threshold voltage of the P-type transistor and the threshold voltage of the N-type transistor.

The mixed cell 410 has the P-type transistors P_VT2 with the threshold voltage Vth_p2 and the N-type transistors N_VT1 with the threshold voltage Vth_n1. In other words, the mixed cell 410 is obtained by mixing the P-type transistors P_VT2 of the second type of regular cell 320 and the N-type transistors N_VT1 of the first type of regular cell 310. The threshold voltages of the P-type transistor P_VT2 and the N-type transistor N_VT1 are similar and have a voltage difference VD_MSVT, and the voltage difference VD_MSVT is different from (e.g., less or more than) the voltage difference VD_VT1 of the first type of regular cell 310 and the voltage difference VD_VT2 of the second type of regular cell 320. Therefore, compared with the first type of regular cell 310 and the second type of regular cell 320, the mixed cell 410 has the adaptive threshold voltages between the P-type and N-type transistors.

The mixed cell 420 has the P-type transistors P_VT3 with the threshold voltage Vth_p3 and the N-type transistors N_VT2 with the threshold voltage Vth_n2. In other words, the mixed cell 420 is obtained by mixing the P-type transistors P_VT3 of the third type of regular cell 330 and the N-type transistors N_VT2 of the second type of regular cell 320. The threshold voltages of the P-type transistor P_VT3 and the N-type transistor N_VT2 are similar and have a voltage difference VD_MLVTLL, and the voltage difference VD_VT2 is less or more than the voltage difference VD_VT2 of the second type of regular cell 320 and the voltage difference VD_VT3 of the third type of regular cell 330.

In some embodiments, the voltage differences VD_VT1, VD_VT3 and VD_VT2 are different. Furthermore, the voltage difference VD_MLVTLL is close to the voltage difference VD_MSVT.

In the mixed cell library 400A, the threshold voltages of the P-type transistor P_VT4 and the N-type transistor N_VT3 of the mixed cell 430 are similar, the threshold voltages of the P-type transistor P_VT5 and the N-type transistor N_VT4 of the mixed cell 440 are similar, and the threshold voltages of the P-type transistor P_VT6 and the N-type transistor N_VT5 of the mixed cell 450 are similar.

Figure 4:
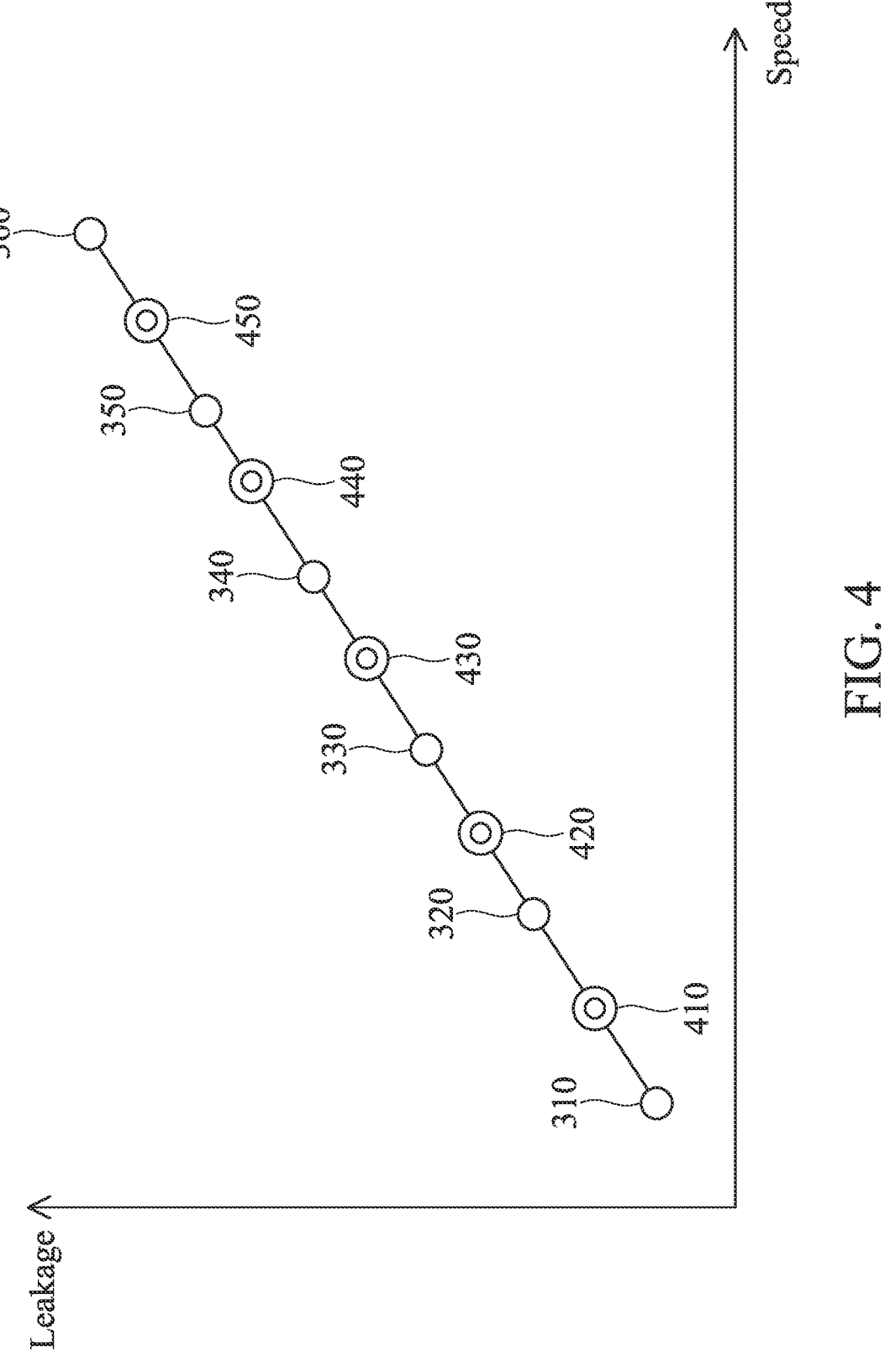
FIG. 4 shows the relationship between speed and leakage of the regular cells and the mixed cells in FIG. 3 according to an embodiment of the invention.

Referring to FIG. 4, FIG. 4 shows the relationship between speed and leakage of the regular cells and the mixed cells in FIG. 3 according to an embodiment of the invention. As shown in FIG. 4, the mixed cells 410 through 450 provide the circuits with more options for speed and leakage energy. For example, the mixed cell 430 is obtained by mixing the P-type transistors P_VT4 of the fourth type of regular cell 340 and the N-type transistors N_VT3 of the third type of regular cell 330. Thus, the leakage and speed of the mixed cell 430 are between the fourth type of regular cell 340 and the third type of regular cell 330.

Referring back to FIG. 2, in step S230, the original layout of the cell array is modified by replacing some regular cells with the mixed cells obtained in step S220 according to the critical paths or specific configurations in the cell array. Various cell replacements are explained below. After completing the replacement in step S230, the modified layout with adaptive threshold voltages is obtained in step S240. As described above, the modified layout will be verified to check whether the layout violates any of the various constraints or rules. If there are no violations in the layout, the IC is fabricated (or implemented) according to the layout.

Figure 5:
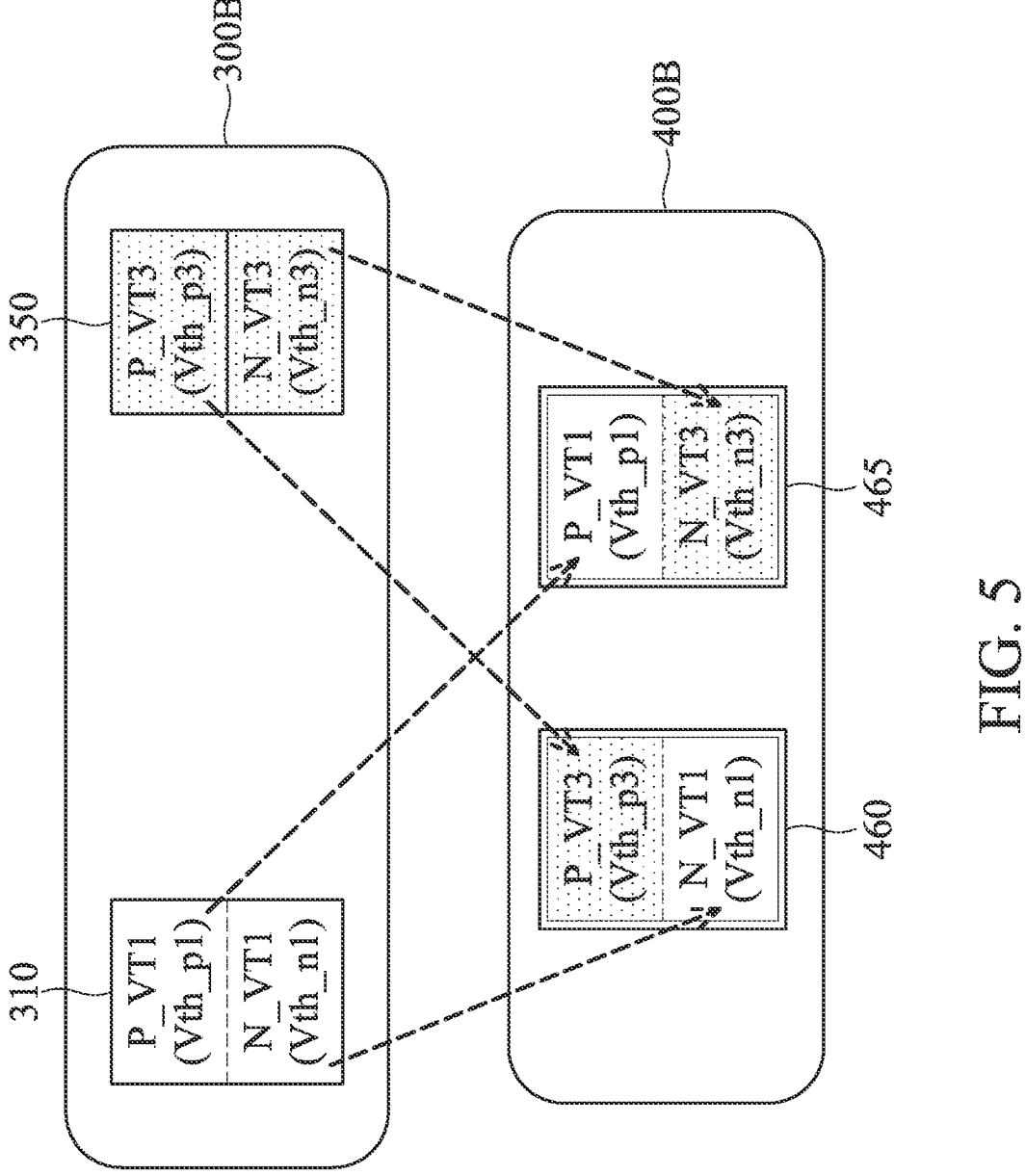
FIG. 5 shows a regular cell library and a mixed cell library according to an embodiment of the invention.

Referring to FIG. 5, FIG. 5 shows a regular cell library 300B and a mixed cell library 400B according to an embodiment of the invention. In FIG. 5, the regular cell library 300B includes the first type of regular cell 310 and the third type of regular cell 330, and the mixed cell library 400B includes the mixed cells 460 and 465. In such embodiment, the regular cells 310 and 330 and the mixed cells 460 and 465 have the same circuit configuration and the same layout size (i.e., cell size). Compared with the regular cells 310 and 330 of the regular cell library 300B, the threshold voltage of the P-type transistor is close to the threshold voltage of the N-type transistor in the mixed cells 460 and 465.

In FIG. 5, the mixed cell 460 has the P-type transistors P_VT3 with the threshold voltage Vth_p3 and the N-type transistors N_VT1 with the threshold voltage Vth_n1. In other words, the mixed cell 460 is obtained by mixing the P-type transistors P_VT3 of the third type of regular cell 330 and the N-type transistors N_VT1 of the first type of regular cell 310. Moreover, the mixed cell 465 has the N-type transistors N_VT3 with the threshold voltage Vth_n3 and the P-type transistors P_VT1 with the threshold voltage Vth_p1. In other words, the mixed cell 465 is obtained by mixing the N-type transistors N_VT3 of the third type of regular cell 330 and the P-type transistors P_VT1 of the first type of regular cell 310.

Figure 6:
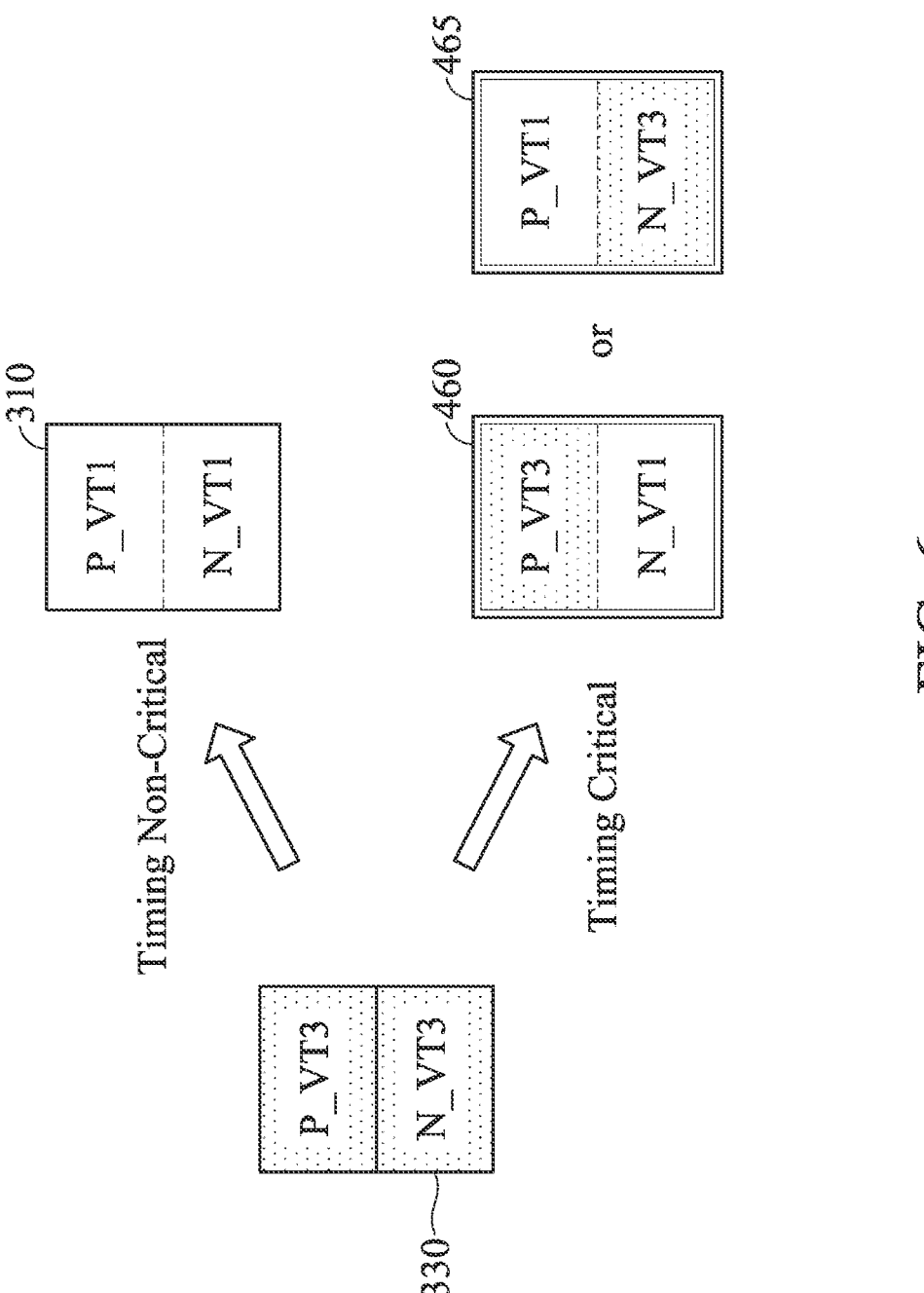
FIG. 6 is a schematic diagram illustrating the replacement of a third regular cell according to an embodiment of the invention.

FIG. 6 is a schematic diagram illustrating the replacement of a third type of regular cell 330 according to an embodiment of the invention. As described above, the leakage and speed of the mixed cells 460 and 465 are between the first type of regular cell 310 and the third type of regular cell 330. Therefore, in the case of power priority (e.g., reducing leakage), the third type of regular cell 330 in a timing non-critical path of the cell array can be replaced with the first type of regular cell 310. Furthermore, the third type of regular cell 330 in a timing critical path of the cell array can be replaced with the mixed cell 460 or 465. On the contrary, in the case of speed priority, the third type of regular cell 330 can be replaced with the mixed cell 430 of FIG. 3. In other words, only the P-type transistors in the third type of regular cell 330 are replaced to obtained the mixed cell 430.

Figure 7:
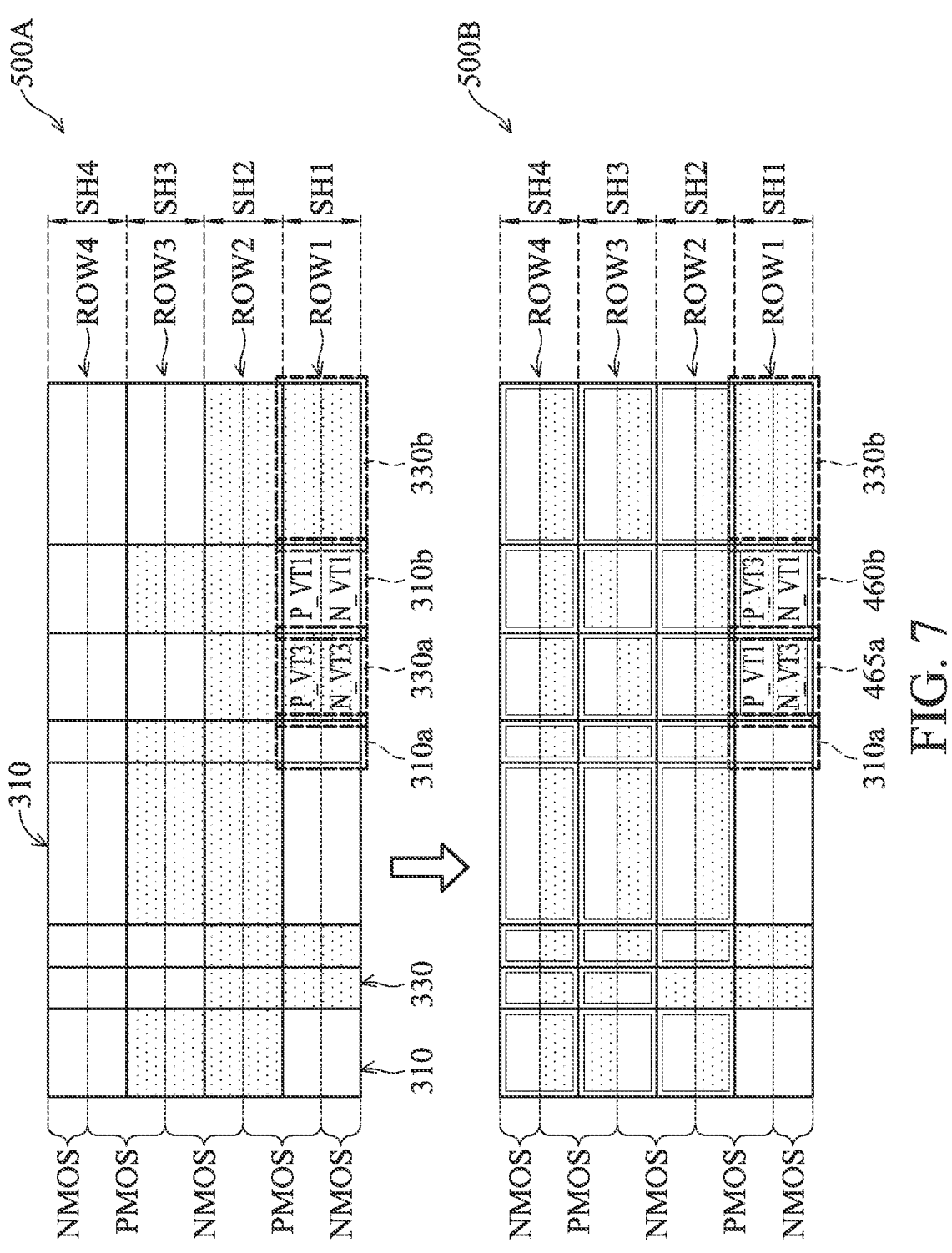
FIG. 7 shows the original layout and the modified layout of a first cell array according to an embodiment of the invention.

FIG. 7 shows the original layout 500A and the modified layout 500B of a first cell array according to an embodiment of the invention. The original layout 500A includes four rows ROW1 through ROW4 of the first cell array. The first type of regular cells 310 and the third type of regular cells 330 having a cell height of SH1 are arranged in the row ROW1. The third type of regular cells 330 having a cell height of SH2 are arranged in the row ROW2. The first type of regular cells 310 and the third type of regular cells 330 having a cell height of SH3 are arranged in the row ROW3. The first type of regular cells 310 having a cell height of SH4 are arranged in the row ROW4. In some embodiments, cell heights SH1 through SH4 are the same. In some embodiments, cell heights SH1 through SH4 are different. Furthermore, the first type of regular cells 310 and the third type of regular cells 330 in the rows ROW1 through ROW4 of the first cell array may have respective circuit configurations for specific functions (or logic operations).

In the original layout 500A, the first type of regular cell 310a, the third type of regular cell 330a, the first type of regular cell 310b and the third type of regular cell 330b are arranged consecutively in the row ROW1. In such embodiment, the first type of regular cell 310b is surrounded by the third type of regular cells 330a and 330b. For better performance, the third type of regular cell 330a and the first type of regular cell 310b are replaced with the mixed cells 465a and 460b, respectively, to obtain the modified layout 500B. As described above, the mixed cell 465a is obtained by mixing the N-type transistors N_VT3 of the third type of regular cell 330 and the P-type transistors P_VT1 of the first type of regular cell 310. Moreover, the mixed cell 460b is obtained by mixing the P-type transistors P_VT3 of the third type of regular cell 330 and the N-type transistors N_VT1 of the first type of regular cell 310. Thus, the mixed cell 465a and the first type of regular cell 310a have the same type of P-type transistors P_VT1 corresponding to the same work-function layer, and the mixed cell 460b and the third type of regular cell 330b have the same type of P-type transistors P_VT3 corresponding to the same work-function layer. In some embodiments, the first type of regular cell 310a and the third type of regular cell 330 are disposed in a timing non-critical path of a circuit, and the mixed cell 465a and the mixed cell 460b are disposed in a timing critical path of the circuit.

Figure 8:
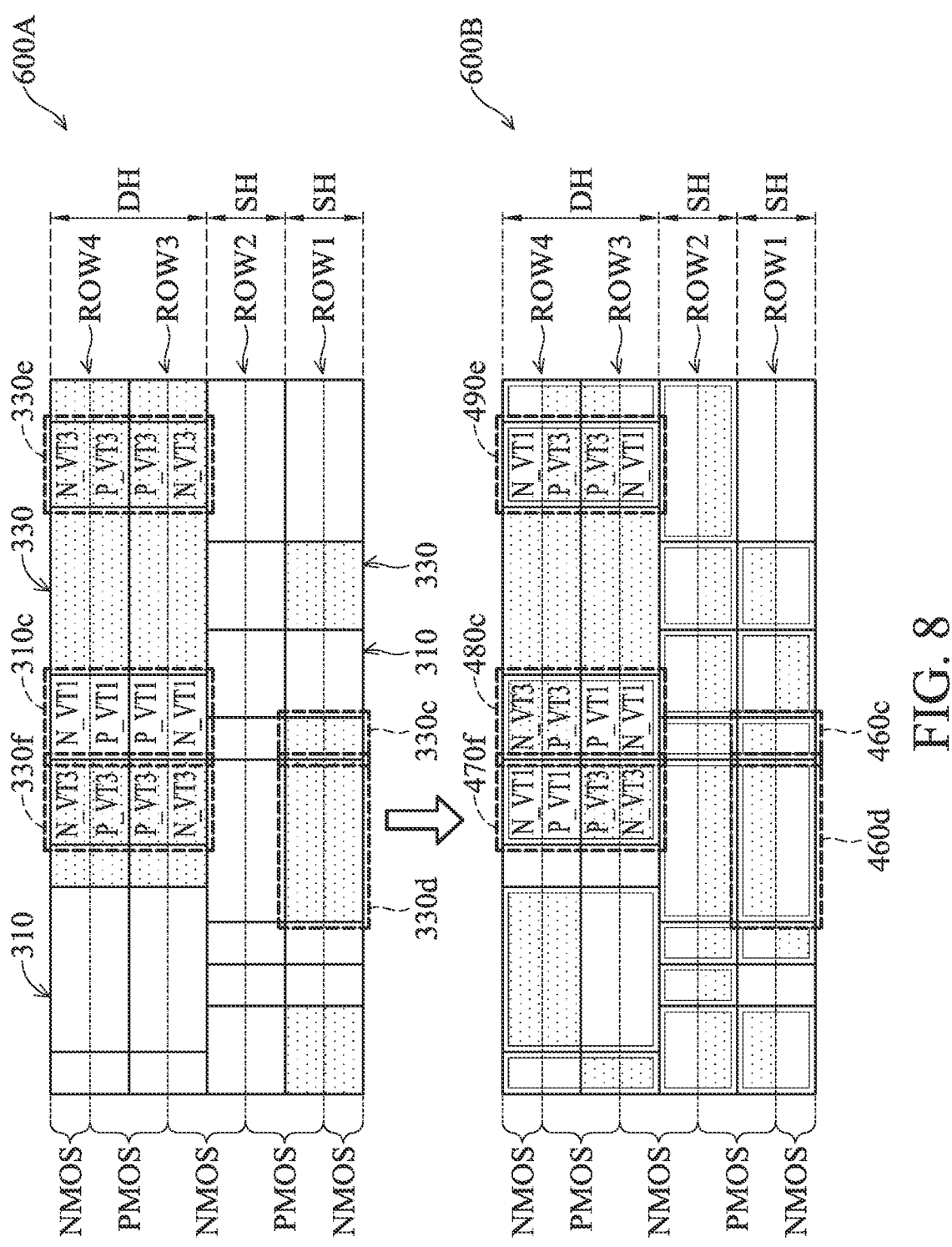
FIG. 8 shows the original layout and the modified layout of a second cell array according to an embodiment of the invention.

FIG. 8 shows the original layout 600A and the modified layout 600B of a second cell array according to an embodiment of the invention. The original layout 600A includes four rows ROW1 through ROW4 of the second cell array. The first type of regular cells 310 and the third type of regular cells 330 having a single-height SH are arranged in the row ROW1. The first type of regular cells 310 having a single-height SH are arranged in the row ROW2. The first type of regular cells 310 and the third type of regular cells 330 having a double-height DH are arranged in rows ROW3 and ROW4. Furthermore, the first type of regular cells 310 and the third type of regular cells 330 in each row of the second cell array may have a respective circuit configuration for each specific function (or logic operations).

In the original layout 600A, the third type of regular cells 330c and 330d are arranged consecutively in the row ROW1, and the third type of regular cells 330c is a filler cell. In some embodiments, the filler cell may be a dummy cell with device or without device. For meting design constraints or rules (e.g., avoiding the layout violates), in the modified layout 600B, the third type of regular cell 330c is replaced with the mixed cell 460c after the third type of regular cell 330d is replaced with the mixed cell 460d. Similarly, the mixed cell 460c is a filler cell. Thus, the threshold voltage layer corresponding to the P-type transistors P_VT3 can be extended from the mixed cell 460d to the mixed cell 460c, thereby meting the minimum width rule of the threshold voltage layer corresponding to the P-type transistors P_VT1 to avoid violation.

In the original layout 600A, the third type of regular cells 330f and 330e and the first type of regular cell 310c are arranged in the rows ROW3 and ROW4. In the first type of regular cell 310c, half of the P-type transistors P_VT1 are arranged in the upper region of the row ROW3, and the remaining half of the P-type transistors P_VT1 are arranged in the lower region of the row ROW4. Furthermore, half of the N-type transistors N_VT1 are arranged in the lower region of the row ROW3, and the remaining half of the N-type transistors N_VT1 are arranged in the upper region of the row ROW4. In the modified layout 600B, the first type of regular cell 310c is replaced with the mixed cell 480c. In the mixed cell 480c, the N-type transistors N_VT1 and the P-type transistors P_VT1 arranged in the row ROW4 are replaced with the N-type transistors N_VT3 and the P-type transistors P_VT3, respectively. Thus, half of the N-type and P-type transistors of the first type of regular cell 310c are replaced to obtained the mixed cell 480c.

In the third type of regular cell 330f, half of the P-type transistors P_VT3 are arranged in the upper region of the row ROW3, and the remaining half of the P-type transistors P_VT3 are arranged in the lower region of the row ROW4. Furthermore, half of the N-type transistors N_VT3 are arranged in the lower region of the row ROW3, and the remaining half of the N-type transistors N_VT3 are arranged in the upper region of the row ROW4. In other words, the P-type transistors P_VT3 are surrounded by the N-type transistors N_VT3 in the third type of regular cell 330f. Similarly, in the third type of regular cell 330e, half of the P-type transistors P_VT3 are arranged in the upper region of the row ROW3, and the remaining half of the P-type transistors P_VT3 are arranged in the lower region of the row ROW4. Furthermore, half of the N-type transistors N_VT3 are arranged in the lower region of the row ROW3, and the remaining half of the N-type transistors N_VT3 are arranged in the upper region of the row ROW4. In other words, the P-type transistors P_VT1 are surrounded by the N-type transistors N_VT1 in the first type of regular cell 310c.

In the modified layout 600B, the third type of regular cells 330f and 330e are replaced with the mixed cells 470f and 490e, respectively. It should be noted that the P-type and N-type transistors have different configurations in the mixed cells 470f and 490e. For example, in the mixed cell 470f, the N-type transistors N_VT3 and the P-type transistors P_VT3 arranged in the row ROW4 are replaced with the N-type transistors N_VT1 and the P-type transistors P_VT1, respectively. Thus, the N-type and P-type transistors arranged in the row ROW4 are replaced to obtained the mixed cell 470f. Moreover, in the mixed cell 490e, the N-type transistors N_VT3 arranged in the rows ROW3 and ROW4 are replaced with the N-type transistors N_VT1. Thus, only the N-type transistors are replaced to obtained the mixed cell 490e. In other words, no P-type transistor P_VT1 and no N-type transistor N_VT3 are present in the mixed cell 490e. In some embodiments, the P-type transistors P_VT3 arranged in the rows ROW3 and ROW4 of the third type of regular cell 330e are replaced with the P-type transistors P_VT1. Thus, only the P-type transistors may be replaced to obtained the mixed cell 490e.

Figure 9:
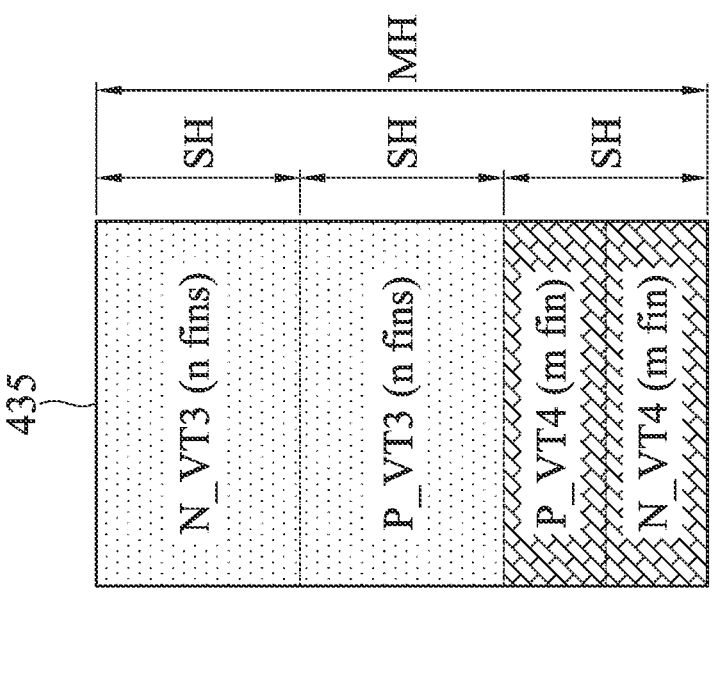
FIG. 9 is a schematic diagram illustrating a replacement of a third regular cell with a multiple-height according to an embodiment of the invention.
Figure 9:
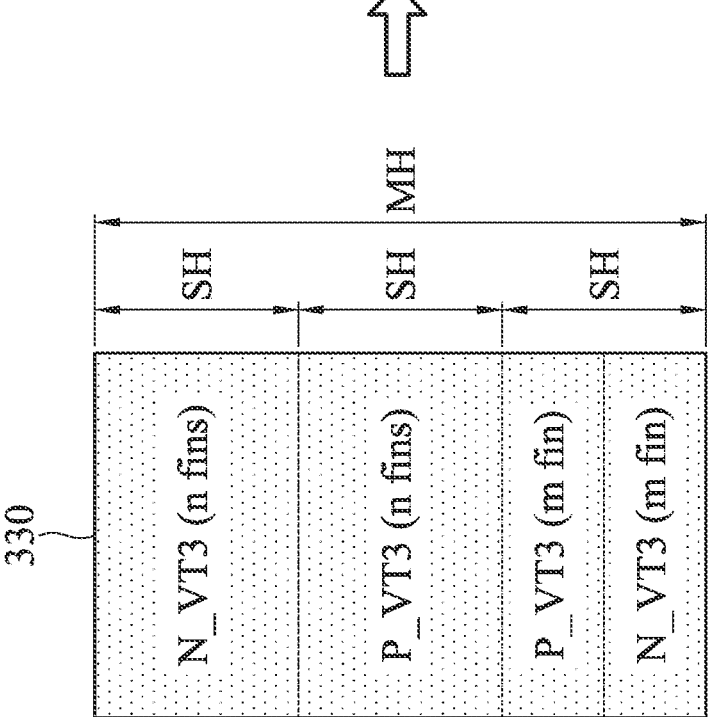

FIG. 9 is a schematic diagram illustrating a replacement of a third type of regular cell 330 with a multiple-height MH according to an embodiment of the invention. In FIG. 7, the multiple-height MH is three times a single-height SH. Each single-height SH corresponds to a respective row of a cell array. For example, the P-type transistors P_VT3 with m fins (m≥1) and the N-type transistors N_VT3 with m fins are arranged in a first row, the P-type transistors P_VT3 with n fins (n>m) are arranged in a second row, and the N-type transistors N_VT3 with n fins are arranged in a third row. In such embodiment, the transistors with less fin are replaced to obtain a mixed cell 435. Therefore, the P-type transistors P_VT3 and the N-type transistors N_VT3 in the first row are replaced with the P-type transistors P_VT4 and the N-type transistors N_VT4 to obtain the mixed cell 435. In some embodiments, in a mixed cell with the single-height SH, only the transistors with fewer fins are replaced.

Figure 10:
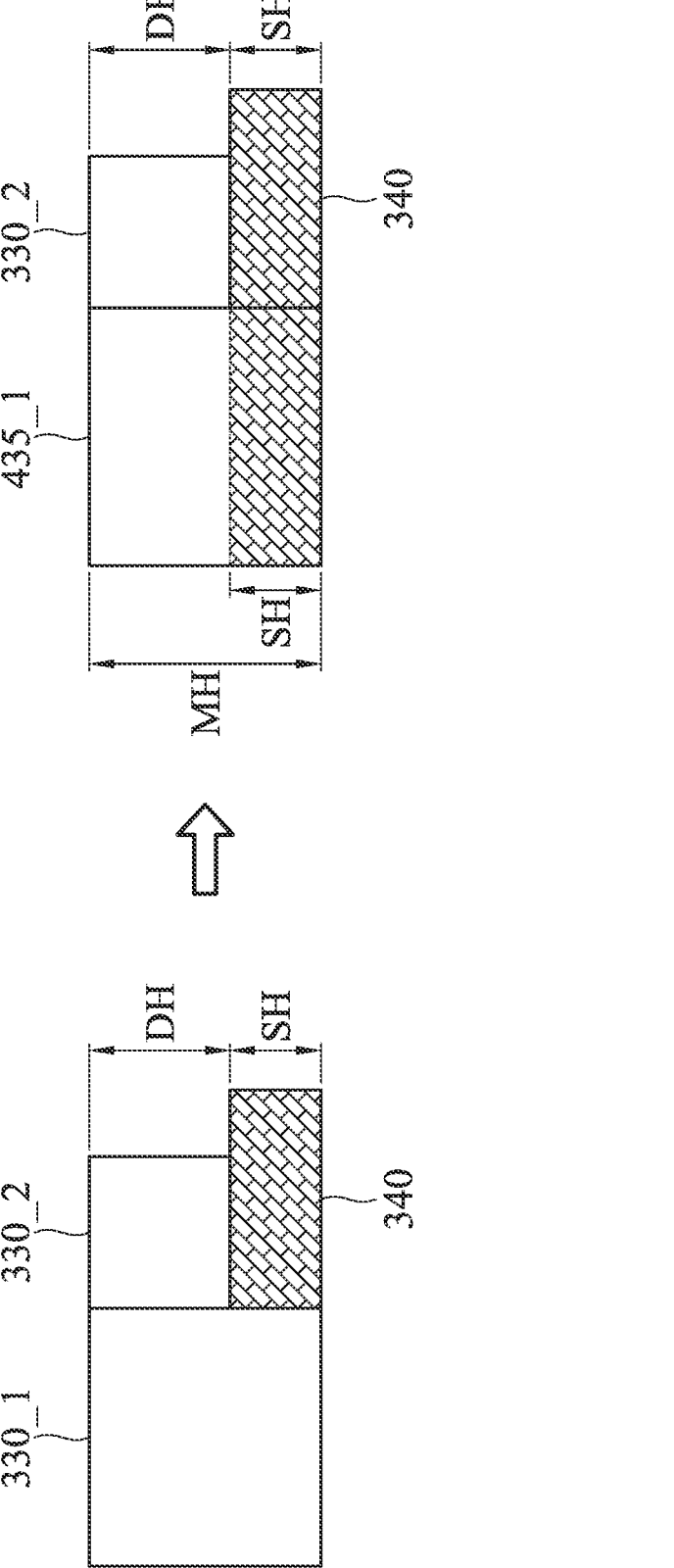
FIG. 10 is a schematic diagram illustrating a replacement of the abutting regular cells with different height according to an embodiment of the invention.

FIG. 10 is a schematic diagram illustrating a replacement of the abutting regular cells with different height according to an embodiment of the invention. In FIG. 10, the fourth type of regular cell 340 has the single-height SH, the third type of regular cell 330_1 has the multiple-height MH, and the third type of regular cell 330_2 has the double-height DH. The fourth type of regular cell 340 and the third type of regular cells 330_1 and 330_2 are adjacent to each other. In such embodiment, the multiple-height MH is three times the single-height SH, and the double-height DH is twice the single-height SH. In order to match the fourth type of regular cell 340, the P-type transistors P_VT3 and the N-type transistors N_VT3 in the lower region (corresponding to the single-height SH) are replaced with the P-type transistors P_VT4 and the N-type transistors N_VT4.

Figure 11:
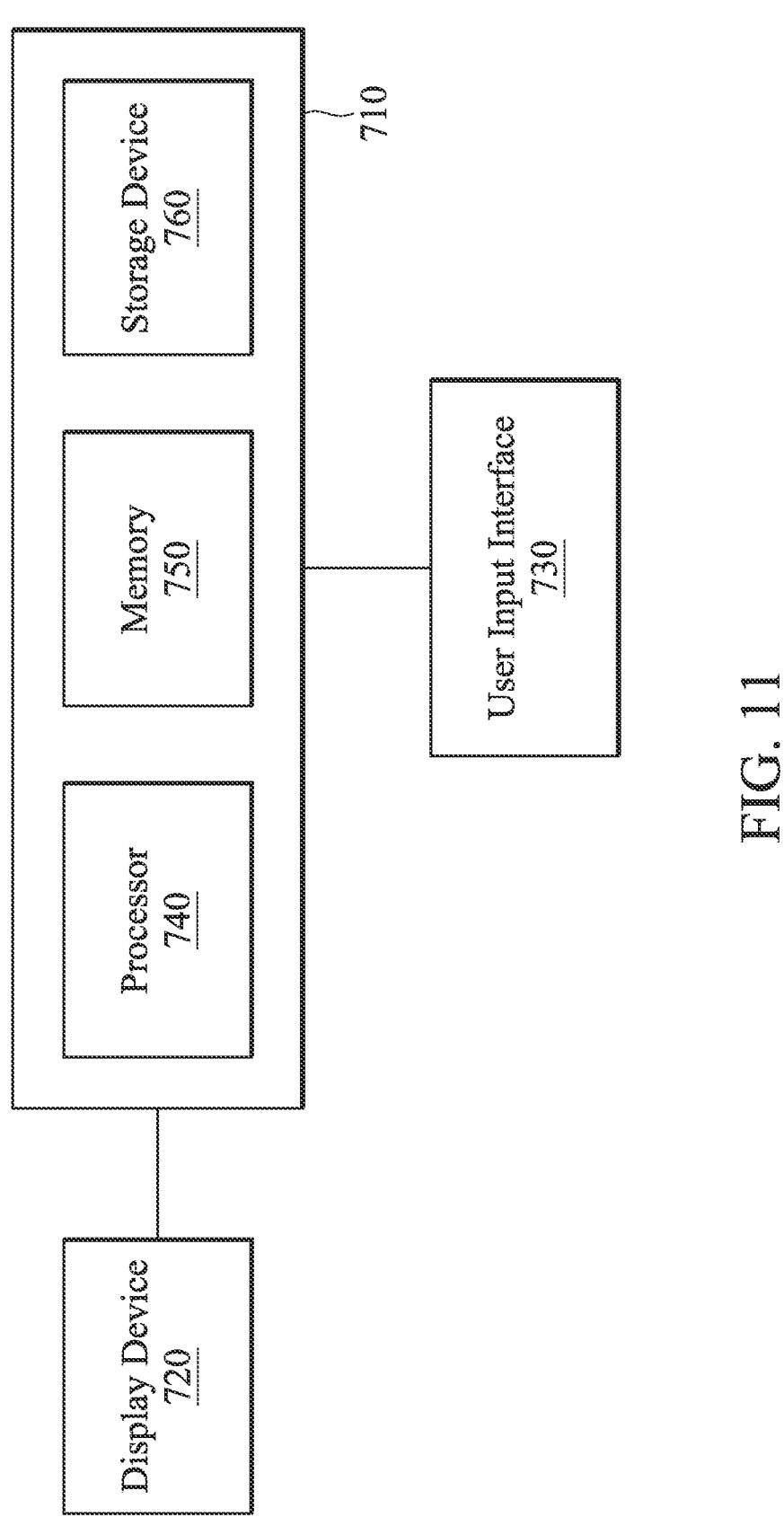
FIG. 11 shows a computer system according to an embodiment of the invention.

FIG. 11 shows a computer system 700 according to an embodiment of the invention. The computer system 700 includes a computer 710, a display device 720 and a user input interface 730, wherein the computer 710 includes a processor 740, a memory 750, and a storage device 760. The computer 710 is coupled to the display device 720 and the user input interface 730, wherein the computer 710 is capable of operating an electronic design automation (EDA) tool. Furthermore, the computer 710 is capable of receiving input instructions or information (e.g. timing constraints, RTL code, or interface information of the memory device) from the user input interface 730 and displaying simulation results, the layout of the IC and the blocks or circuits of the layout on the display device 720. In some embodiments, the display device 720 is a GUI for the computer 710. Furthermore, the display device 720 and the user input interface 730 can be implemented in the computer 710. The user input interface 730 may be a keyboard, a mouse, and so on. In the computer 710, the storage device 760 can store the operating systems (OSs), applications, information (e.g. circuit function information and power-related information) and data that includes input required by the applications and/or output generated by applications. The processor 740 of the computer 710 can perform one or more operations (either automatically or with user input) in any method that is implicitly or explicitly described in this disclosure. For example, during an operation, the processor 740 can load the applications of the storage device 760 into the memory 750, and then the applications can be used by the user to create, view, and/or edit a placement, a floor plan and a physical layout for a circuit design (e.g., the cell array with adaptive threshold voltages).

The data structures and code described in this disclosure can be partially or fully stored on a computer-readable storage medium and/or a hardware module and/or hardware apparatus. A computer-readable storage medium may be, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Examples of hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a cell array, comprising:
a first mixed cell comprising:
at least one first P-type transistor with a first threshold voltage in an upper region of a first row of the cell array, and at least one first N-type transistor with a second threshold voltage in a lower region of the first row of the cell array; and
at least one second P-type transistor with a third threshold voltage in a lower region of a second row of the cell array, and at least one second N-type transistor with a fourth threshold voltage in a lower region of the second row of the cell array; and
a second mixed cell comprising:
at least one of the second P-type transistor with the third threshold voltage in the upper region of the first row of the cell array, and at least one of the first N-type transistor with the second threshold voltage in the lower region of the first row of the cell array; and
at least one of the second P-type transistor with the third threshold voltage in the lower region of the second row of the cell array, and at least one of the first N-type transistor with the second threshold voltage in the lower region of the second row of the cell array,
wherein the first and second rows of the cell array are the same height,
wherein a first voltage difference between the first and second threshold voltages is different from a second voltage difference between the third and fourth threshold voltages.

2. The semiconductor structure as claimed in claim 1, wherein the first and second P-type transistors are surrounded by the first and second N-type transistors in the first mixed cell, and the second P-type transistors are surrounded by the first N-type transistors.

3. The semiconductor structure as claimed in claim 1, wherein the second mixed cell has no first P-type transistor or second N-type transistor.

4. The semiconductor structure as claimed in claim 1, wherein the cell array further comprises:
a third mixed cell comprising:

at least one of the second P-type transistor with the third threshold voltage and at least one of the second N-type transistor with the fourth threshold voltage in the first row of the cell array; and
at least one of the first P-type transistor with the first threshold voltage and at least one of the first N-type transistor with the second threshold voltage in the second row of the cell array.

5. The semiconductor structure as claimed in claim 1, wherein the cell array further comprises:
a fourth mixed cell comprising:
at least one of the first P-type transistor with the first threshold voltage and at least one of the second N-type transistor with the fourth threshold voltage in the first row of the cell array; and
at least one of the first P-type transistor with the first threshold voltage and at least one of the second N-type transistor with the fourth threshold voltage in the second row of the cell array.

6. The semiconductor structure as claimed in claim 1, wherein the cell array further comprises:
a first regular cell, wherein each P-type transistor has the first threshold voltage and each N-type transistor has the second threshold voltage in the first and second rows of the cell array.

7. The semiconductor structure as claimed in claim 1, wherein the cell array further comprises:
a second regular cell, wherein each P-type transistor has the third threshold voltage and each N-type transistor has the fourth threshold voltage in the first and second rows of the cell array.

8. The semiconductor structure as claimed in claim 1, wherein the cell array further comprises:
a third regular cell, wherein each P-type transistor has the first threshold voltage and each N-type transistor has the second threshold voltage in the first row of the cell array; and
a fourth regular cell, wherein each P-type transistor has the third threshold voltage and each N-type transistor has the fourth threshold voltage in the second row of the cell array.

9. The semiconductor structure as claimed in claim 1, wherein the third threshold voltage is higher than the first threshold voltage, and the fourth threshold voltage is higher than the second threshold voltage.

10. The semiconductor structure as claimed in claim 1, wherein in an arrangement direction of the first row and the second row, the first P-type transistor with the first threshold voltage is between the first N-type transistor with the second threshold voltage and the second P-type transistor with the third threshold voltage.

11. The semiconductor structure as claimed in claim 1, wherein in an arrangement direction of the first row and the second row, the second P-type transistor with the third threshold voltage is between the first P-type transistor with the first threshold voltage and the second N-type transistor with the fourth threshold voltage.

* * * * *